(12) United States Patent
Yamaji et al.

(10) Patent No.: US 8,564,171 B2
(45) Date of Patent: Oct. 22, 2013

(54) ACOUSTIC WAVE ELEMENT AND ELECTRONIC DEVICE INCLUDING THE SAME

(75) Inventors: Toru Yamaji, Osaka (JP); Mitsuhiro Furukawa, Hyogo (JP); Koji Kawakita, Nara (JP); Eiji Kawamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 13/248,148

(22) Filed: Sep. 29, 2011

(65) Prior Publication Data

US 2012/0086309 A1 Apr. 12, 2012

(30) Foreign Application Priority Data

Oct. 7, 2010 (JP) ................................. 2010-227096

(51) Int. Cl.
*H03H 9/25* (2006.01)

(52) U.S. Cl.
USPC ............... 310/313 R; 310/313 A; 310/313 B; 310/344

(58) Field of Classification Search
USPC .......... 333/193, 195, 194; 310/313 A, 313 B, 310/313 R, 311, 348, 344

IPC ........................................................ H03H 9/25
See application file for complete search history.

(56) References Cited

U.S. PATENT DOCUMENTS

| 7,259,500 B2 * | 8/2007 | Iwamoto et al. | 310/344 |
| 8,334,737 B2 * | 12/2012 | Yamaji et al. | 310/344 |
| 2011/0012695 A1 * | 1/2011 | Yamaji et al. | 333/193 |

FOREIGN PATENT DOCUMENTS

| JP | 2009-267484 | * 11/2009 | ............... H03H 9/25 |
| WO | 2006/106831 | 10/2006 | |

* cited by examiner

*Primary Examiner* — Thomas Dougherty
*Assistant Examiner* — Karen B Addison
(74) *Attorney, Agent, or Firm* — Wenderoth, Lind & Ponack, L.L.P.

(57) ABSTRACT

An acoustic wave element includes a piezoelectric substrate, an IDT electrode, a sidewall, a lid, and an adhesive layer. The IDT electrode is provided on the piezoelectric substrate. The sidewall is provided around the IDT electrode above the piezoelectric substrate. The lid is provided above the sidewall so as to cover a space above the IDT electrode. The adhesive layer is made of an adhesive provided between the lid and the sidewall. The top surface of the sidewall has a groove. The groove is filled with an adhesive, which reduces the protrusion amount of the adhesive.

15 Claims, 8 Drawing Sheets

ACOUSTIC WAVE ELEMENT AND ELECTRONIC DEVICE INCLUDING THE SAME

BACKGROUND OF THE INVENTION

1. Field of the Invention

The present invention relates to an acoustic wave element and to an electronic device such as a mobile phone.

2. Background Art

Hereinafter, a description is made of a conventional acoustic wave element using FIG. 7. FIG. 7 is a schematic sectional view of a conventional acoustic wave element.

There is known a chip-size package element as shown in FIG. 7 as conventional acoustic wave element 101. Element 101 includes piezoelectric substrate 102 and IDT electrode 103 placed on substrate 102. Insulating body 110 is formed on piezoelectric substrate 102 so as to cover IDT electrode 103. Body 110 protects electrode 103 from the external environment.

This conventional acoustic wave element 101 further includes internal electrode 104, sidewall 105, and lid 107. Internal electrode 104 is placed on piezoelectric substrate 102 and is electrically connected to IDT electrode 103. Internal electrode 104 is made of aluminum for example. Sidewall 105 is provided around IDT electrode 103 on piezoelectric substrate 102. Lid 107 is provided on sidewall 105 so as to cover space 108 above IDT electrode 103 through adhesive layer 106 made of an adhesive.

Examples of prior art documents related to this application include WO/2006/106831.

In the process of manufacturing above-described conventional acoustic wave element 101, lid 107 is bonded onto the top surface of sidewall 105 with an adhesive. This bonding pressure causes the adhesive to protrude from between sidewall 105 and lid 107. A large amount of the adhesive protrusion leads to poor connection between an external electrode (not shown) and internal electrode 104 and causes the adhesive to contact IDT electrode 103. Meanwhile, decreasing the bonding pressure to reduce the protrusion amount of the adhesive reduces the close-contact strength between sidewall 105 and lid 107, which causes a reliability defect in acoustic wave element 101.

SUMMARY OF THE INVENTION

An acoustic wave element of the present invention includes a piezoelectric substrate, an IDT electrode, a sidewall, a lid, and an adhesive layer. The IDT electrode is placed on the piezoelectric substrate. The sidewall is provided around the IDT electrode above the piezoelectric substrate. The lid is provided above the sidewall so as to cover the space above IDT electrode. The adhesive layer is made of an adhesive provided between the lid and the sidewall. The top surface of the sidewall has a groove. The groove is filled with an adhesive.

According to the acoustic wave element of the present invention as described above, the groove provided in the top surface of the sidewall can reduce the protrusion amount of the adhesive. This enables the lid to be bonded onto the sidewall with a sufficient pressure, which increases the close-contact strength between the sidewall and lid. Further, the groove exhibits an anchor effect, which also increases the close-contact strength between the sidewall and lid. This increases the reliability and yield of acoustic wave elements.

DETAILED DESCRIPTION OF THE INVENTION

First Exemplary Embodiment

Hereinafter, a description is made of an acoustic wave element according to the first exemplary embodiment of the present invention with reference to the related drawings.

Figure 1:
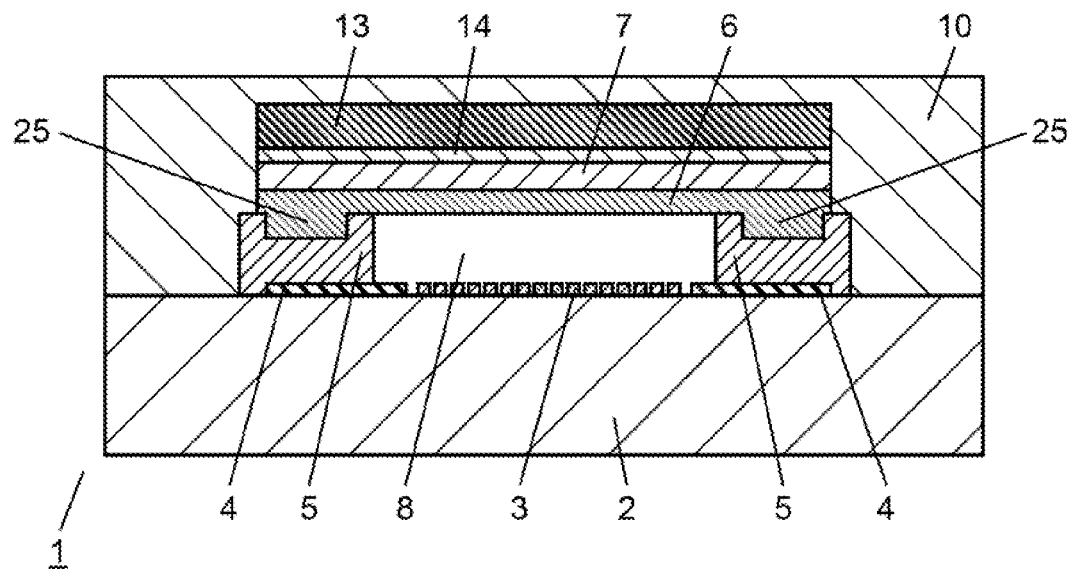
FIG. 1 is a schematic sectional view of an acoustic wave element according to an embodiment of the present invention.

FIG. 1 is a schematic sectional view of an acoustic wave element according to the first embodiment of the present invention.

Acoustic wave element 1 is a chip-size package element. In FIG. 1, element 1 includes piezoelectric substrate 2, IDT (interdigital transducer) electrode 3 provided on the top surface (main surface) of piezoelectric substrate 2. Insulating body 10 is formed on piezoelectric substrate 2 so as to cover IDT electrode 3 to protect IDT electrode 3 from the external environment.

Acoustic wave element 1 further includes internal electrode 4, sidewall 5, lid 7, and adhesive layer 6. Internal electrode 4 is provided on piezoelectric substrate 2 and is electrically connected to IDT electrode 3. Sidewall 5 is provided around IDT electrode 3 on the top surface of piezoelectric substrate 2 and on the top surface of internal electrode 4. Lid 7 is provided above sidewall 5 so as to cover space 8 above IDT electrode 3. Adhesive layer 6 is provided between lid 7 and sidewall 5.

Further, the top surface of sidewall 5 has groove 25. Groove 25 is filled with an adhesive of adhesive layer 6. Groove 25 provided in the top surface of sidewall 5 thus reduces the protrusion amount of the adhesive. This enables lid 7 to be bonded onto sidewall 5 with a sufficient pressure, which increases the close-contact strength between sidewall 5 and lid 7. Further, groove 25 exhibits an anchor effect, which also increases the close-contact strength between sidewall 5 and lid 7. These conditions increase the reliability and yield of acoustic wave elements 1.

Acoustic wave element 1 may include lid reinforcing layer 14 to increase the mechanical strength of lid 7. Layer 14 is provided on lid 7 through lid base layer 13. Layer 14 is made of plated metal.

Acoustic wave element 1 may further include a sidewall reinforcing layer (not shown). The layer is provided through a sidewall base layer (not shown) so as to cover the outer side surface of sidewall 5. The sidewall reinforcing layer is made of plated metal. The layer is electrically connected to lid reinforcing layer 14.

Figure 2:
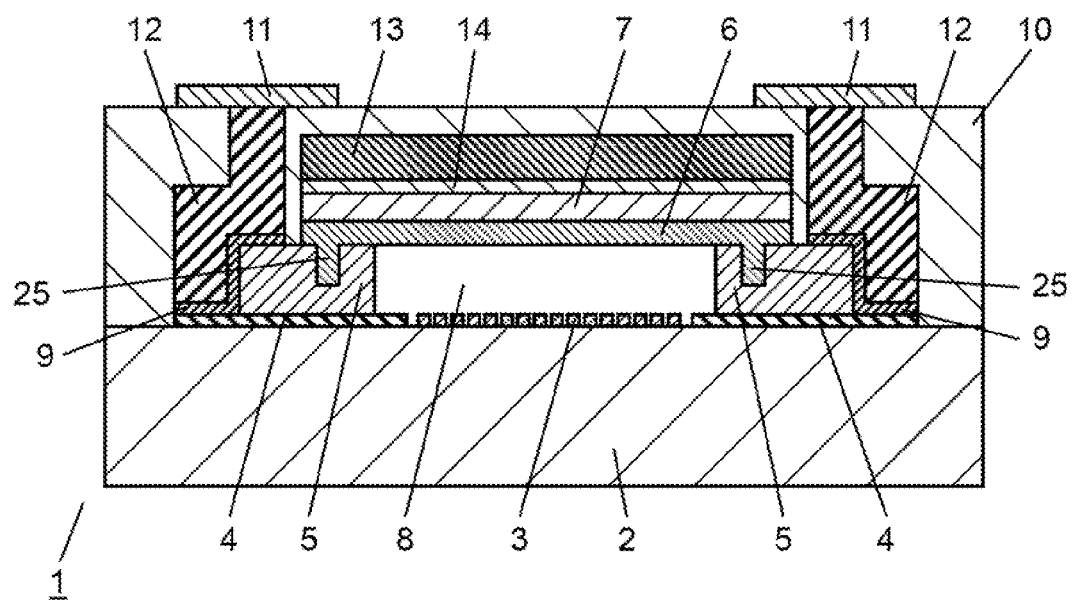
FIG. 2 is another schematic sectional view of the acoustic wave element.

FIG. 2 is a schematic sectional view of acoustic wave element 1 including connection electrode 12, according to the first embodiment of the present invention.

In FIG. 2, acoustic wave element 1 further includes electrode base layer 9 and connection electrode 12. Layer 9 is provided at the outer side of sidewall 5 viewed from space 8, on the outer side surface of sidewall 5, and on sidewall 5, above internal electrode 4. Electrode 12 is provided on electrode base layer 9 so as to penetrate insulating body 10. Electrode 12 electrically connects external electrode 11 to IDT electrode 3. Electrode 12 is made of plated metal.

Hereinafter, a detailed description is made of each component of acoustic wave element 1.

Piezoelectric substrate 2 is made of a single-crystal piezoelectric body with its board thickness of approximately 100 to 350 μm. Substrate 2 is made of a substance based on crystal, lithium tantalate, lithium niobate, or potassium niobate, for example.

IDT electrode 3 is comb-shaped with its film thickness of approximately 0.1 to 0.5 μm. IDT electrode 3 is formed of one of the following three types of materials: a single metal such as aluminum, copper, silver, gold, titanium, tungsten, platinum, chromium, or molybdenum; an alloy primarily containing one of these metals; or a lamination of one of these metals.

Internal electrode 4 is a conductor electrically connecting IDT electrode 3 to external electrode 11. Electrode 4 is formed of one of the following three types of materials: a single metal such as aluminum, copper, or silver; an alloy primarily containing one of these metals; or a lamination of one of these metals.

Sidewall 5 has a height of approximately 5 to 15 μm and encloses at least part of the periphery of IDT electrode 3. Sidewall 5 is made of resin, which is easy to process into a given shape. The particular use of a photosensitive resin for sidewall 5 allows sidewall 5 to be accurately formed into a desired shape for producing plural acoustic wave elements on piezoelectric substrate 2. Various types of materials can be used for the photosensitive resin, such as photosensitive polyimide resin, photosensitive epoxy resin, and photosensitive acrylate resin. Photosensitive polyimide resin, with a high glass transition point, is highly reliable under a high-temperature environment, which is particularly preferable for sidewall 5.

Figure 3:
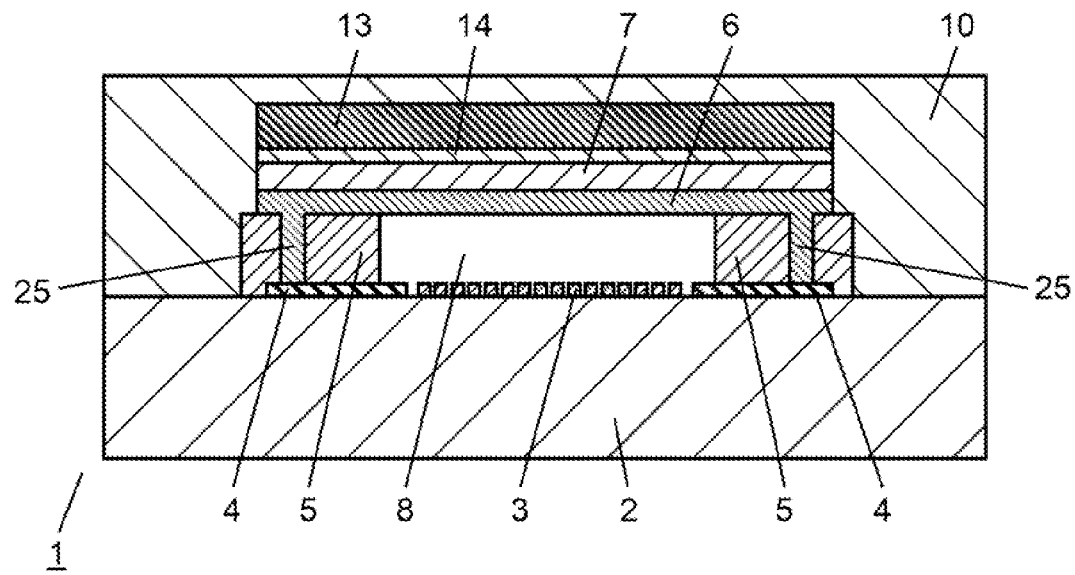
FIG. 3 is yet another schematic sectional view of the acoustic wave element.

Further, as shown in FIG. 1, it is desirable that groove 25 at the top of sidewall 5 does not penetrate sidewall 5, which secures the physical strength of sidewall 5. Meanwhile, as shown in FIG. 3, groove 25 at the top of sidewall 5 may penetrate sidewall 5, which further reduces the protrusion amount of the adhesive of adhesive layer 6. The area size of the opening of groove 25 is desirably larger than that of the top surface of sidewall 5 with the opening of groove 25 excluded, which further reduces the protrusion amount of the adhesive.

Figure 4:
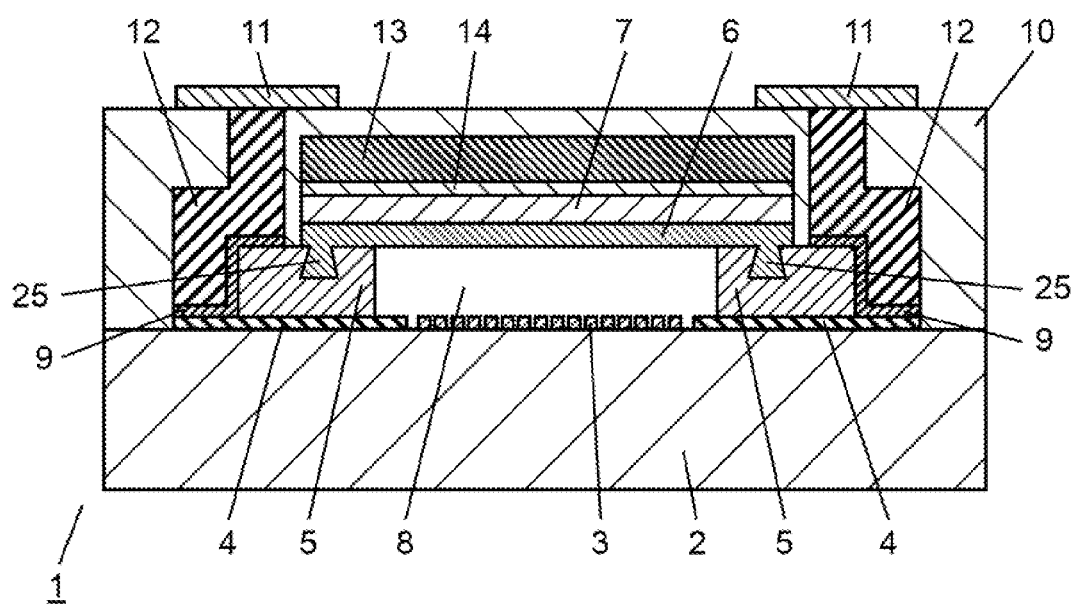
FIG. 4 is still another schematic sectional view of the acoustic wave element.

Furthermore, as shown in FIG. 4, the space between the side surfaces of groove 25 desirably becomes wider downwards. That is, the base area of groove 25 is larger than the opening area of groove 25 in the top surface of sidewall 5, which increases an anchor effect of groove 25. This reverse-tapered groove 25 can be produced by using a positive photoresist.

Adhesive layer 6 is an adhesive with its thickness of approximately 1 to 10 μm. Layer 6 is made of a material with its adhesive strength per unit area to insulating body 10 stronger than that to sidewall 5. Layer 6 is made of a resin based on epoxy, polyphenylene, or butadiene; or a mixed resin of these for example.

Lid 7 is a top plate with its thickness of approximately 1 to 10 μm. Lid 7 is retained by being bonded onto the top of sidewall 5 through adhesive layer 6. Lid 7 accommodates IDT electrode 3 together with piezoelectric substrate 2 and sidewall 5. Lid 7 is preferably made of metal. When metal is used for lid 7, its excellent mechanical strength and conductivity allow for controlling of the electric potential of lid 7. Lid 7 is further preferably made of copper. When copper is used for lid 7, its coefficient of linear expansion is substantially equal to that of single-crystal piezoelectric substrate 2, and thus lid 7 can be foil-shaped. Further, when adhesive layer 6 is formed preliminarily and then lid 7 is stuck onto the top of sidewall 5, handling in manufacturing is convenient.

Space 8 is an area enclosed by piezoelectric substrate 2, sidewall 5, and lid 7. Space 8 has hermeticity and accommodates IDT electrode 3 inside thereof. Space 8 may be filled with air at normal air pressure. The inside of space 8 is further preferably sealed under decompression, which prevents IDT electrode 3 from corroding.

Electrode base layer 9 is formed outside sidewall 5 (i.e. the side of sidewall 5 opposite to space 8) and on the outer side surface of sidewall 5, above internal electrode 4. Layer 9 is a metal thin film. Layer 9 is made of a material with its solubility into a plating liquid lower than that of internal electrode 4, including a single metal such as titanium, copper, nickel, chromium, or magnesium; or an alloy primarily containing one of these metals. Titanium especially has high close-contact property, which is preferable for layer 9. When layer 9 has a two-layer structure in which copper is placed on the top of titanium, connection electrode 12 (described later) is preferably formed easily.

Insulating body 10 is formed on piezoelectric substrate 2 so as to cover lid reinforcing layer 14. Further, this body 10 covers the entire main surface of piezoelectric substrate 2 to protect elements such as IDT electrode 3 from a mechanical shock for example. Here, body 10 does not need to be provided on the top of lid 7, and lid reinforcing layer 14 may be exposed. For the material of body 10, a thermosetting resin is preferably used, which has excellent handleability. For the material of body 10, an epoxy resin especially is preferable in thermal resistance and hermeticity. Moreover, for the material of body 10, an epoxy resin containing an inorganic filler is further preferable, which decreases the coefficient of linear expansion. The inorganic filler may be a powder such as alumina powder, silicon dioxide powder, or magnesium oxide powder, but is not limited to these powders; various types of inorganic materials can be used.

External electrode 11 is formed outside insulating body 10. Electrode 11 is a terminal for connecting to another element, namely for electrically connecting to connection electrode 12. In this embodiment, insulating body 10 is formed between electrode 11 and sidewall 5, resulting in electrode 11 not directly contacting sidewall 5.

Connection electrode 12 is formed on internal electrode 4 through electrode base layer 9 by electrolytic plating. Possible examples of a material of electrode 12 include a single metal such as copper, gold, silver, platinum, or nickel; or an alloy primarily containing one of these metals. For the material of electrode 12, copper is preferably used, which has excellent mechanical strength and the coefficient of linear expansion can be made to match with piezoelectric substrate 2. Here, this electrode 12 is electrically connected to internal electrode 4. However, when electrode 12 is connected to an I/O terminal, electrode 12 is electrically isolated from lid 7, lid base layer 13, and lid reinforcing layer 14. Meanwhile, when electrode 12 is connected to a ground terminal, electrode 12 is connected to lid 7, lid base layer 13, and lid reinforcing layer 14, which stabilizes the ground potential.

Lid base layer 13 is a metal thin film formed on lid 7. Layer 13 can be made of a single metal such as titanium, copper, nickel, chromium, or magnesium; or an alloy primarily containing one of these metals. Titanium especially has a high close-contact property, which is preferable for layer 13. When layer 13 has a two-layer structure in which copper is placed on the top of titanium, lid reinforcing layer 14 (described later) is preferably formed easily. Layer 13 becomes a base for electrolytic plating.

Lid reinforcing layer 14 is formed on the top surface of lid base layer 13 so as to be approximately 20 to 40 μm in thickness by electrolytic plating. Possible examples of a material of layer 14 include a single metal such as copper, gold, silver, platinum, or nickel; or an alloy primarily containing one of these metals. For the material of layer 14, copper is preferably used, which has excellent mechanical strength and the coefficient of linear expansion can be made to match with piezoelectric substrate 2.

The sidewall base layer (not shown) is a metal thin film formed outside sidewall 5 viewed from space 8 (i.e. the side of sidewall 5 opposite to space 8) and on the outer side surface or top surface of sidewall 5, above internal electrode 4. The sidewall base layer is made of a material with its solubility into a plating liquid lower than that of internal electrode 4, including a single metal such as titanium, copper, nickel, chromium, or magnesium; or an alloy primarily containing one of these metals. Titanium especially has a high close-contact property, which is preferable for the sidewall base layer.

When sidewall base layer 20 (FIG. 5J) has a two-layer structure in which copper is placed on the top of titanium, sidewall reinforcing layer 15 (FIG. 5J) is preferably formed easily.

The sidewall reinforcing layer (not shown) is electrically connected to lid reinforcing layer 14. The sidewall reinforcing layer is formed approximately 20 to 40 μm in thickness by electrolytic plating so as to cover the sidewall base layer. Possible examples of a material of the sidewall reinforcing layer include a single metal such as copper, gold, silver, platinum, or nickel; or an alloy primarily containing one of these metals. For the material of the sidewall reinforcing layer, copper is preferably used, which has excellent mechanical strength and the coefficient of linear expansion can be made to match with piezoelectric substrate 2. This sidewall reinforcing layer (not shown) is formed of plated metal, which suppresses moisture ingress from outside acoustic wave element 1 through sidewall 5. This prevents chronological characteristic degradation of acoustic wave element 1. Further, the impact resistance of acoustic wave element 1 can be increased by increasing the mechanical strength of sidewall 5 with sidewall reinforcing layer 15.

As shown in FIG. 1, lid 7 is desirably provided inside the outer edge of the top surface of sidewall 5. Further, adhesive layer 6 is desirably formed so as to protrude outside the outer edge of lid 7 viewed from above acoustic wave element 1. The presence of adhesive layer 6 increases the close-contact strength between sidewall 5 and insulating body 10 to prevent detachment at the boundary between them, thus increasing the mechanical strength of acoustic wave element 1.

The end of adhesive layer 6 is desirably formed so as to run along the outer edge of the top surface of sidewall 5 viewed from above acoustic wave element 1. Also, the end of adhesive layer 6 is desirably formed inside the outer edge of the top surface of sidewall 5 viewed from above acoustic wave element 1. When electrode base layer 9 or the sidewall base layer is sputter-formed, the above condition prevents, the layer from becoming resistant to adhering onto internal electrode 4 or onto the outer side surface of sidewall 5.

Hereinafter, a description is made of a method of manufacturing acoustic wave elements according to the first embodiment structured as above.

FIGS. 5A through 5K show processes of manufacturing acoustic wave elements 1 according to the first embodiment.

Figure 5A:
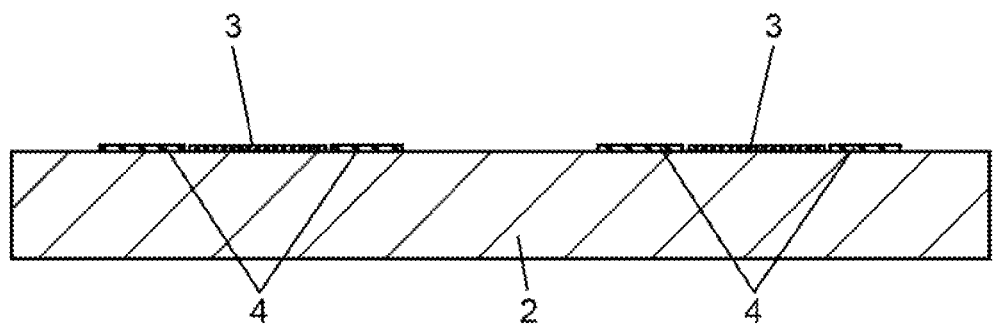
FIG. 5A is an explanatory diagram of a process of manufacturing acoustic wave elements according to the embodiment of the present invention.

First, as shown in FIG. 5A, plural IDT electrodes 3 are sputter-formed on the surface of piezoelectric substrate 2 by photolithography using a resist, and internal electrode 4 is deposit-formed.

Figure 5B:
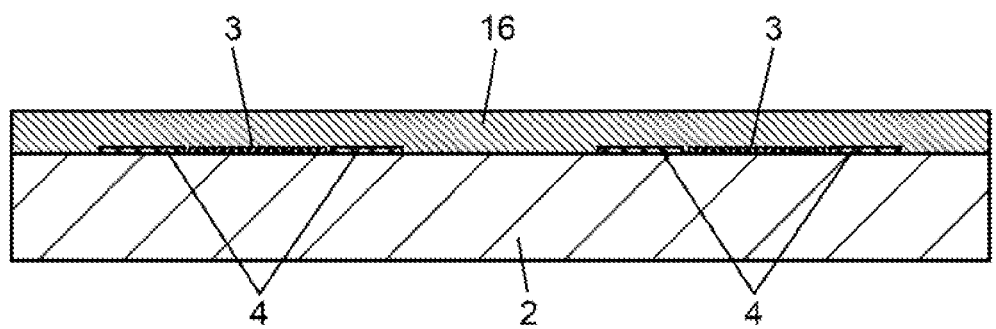
FIG. 5B is an explanatory diagram of the process.

Next, as shown in FIG. 5B, photosensitive polyimide-based resin 16 is formed on the entire main surface of piezoelectric substrate 2, covering IDT electrode 3 and internal electrode 4. To form photosensitive polyimide-based resin 16, a film forming process, such as spin coating, dispensing, or screen printing, is used. Spin coating especially is preferable as a way of forming uniform film thickness.

Figure 5C:
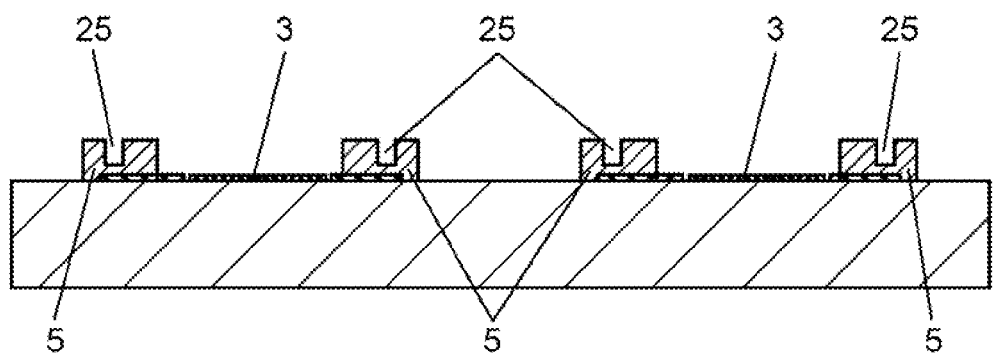
FIG. 5C is an explanatory diagram of the process.

Then, exposure and development are performed from the top surface of photosensitive polyimide-based resin 16 to thermally harden resin 16, which forms sidewall 5 enclosing IDT electrode 3 as shown in FIG. 5C. Here, after sidewall 5 is processed into a given shape, it is heat-processed as required to promote hardening of the material.

To form sidewall 5 having groove 25 not penetrating sidewall 5, a method of performing two-time photolithography processes can be used. Specifically, as the first photolithography process, polyimide-based resin 16 is formed to the level of the bottom surface of groove 25, and then the part other than sidewall 5 is masked, exposed, and developed to remove resin 16 on the part other than sidewall 5. As the second photolithography process, resin 16 is formed to the level of sidewall 5, and then the top of the part other than sidewall 5 and the top of groove 25 are masked, exposed, and developed to remove resin 16 on these parts. This forms sidewall 5 having groove 25 not penetrating sidewall 5. To form groove 25 by another process, a resin (e.g. polyimide-based resin) with its curing shrinkage ratio higher than 30% is used, in which a shape change due to the curing shrinkage makes the end of the top surface of sidewall 5 thicker than the central part, thereby forming groove 25 in the top surface of sidewall 5. When a resin (e.g. polyimide-based resin) with its curing shrinkage ratio higher than 60% is used, however, an interface stress caused by the curing shrinkage makes sidewall 5 detach from piezoelectric substrate 2. Consequently, the optimum curing shrinkage ratio of sidewall 5 is desirably between 30% and 60%. When using a negative resist, groove 25 can be formed with the response rate to exposure decreased by performing exposure with the transmittance of the mask on groove 25 decreased.

When groove 25 is formed so as to penetrate sidewall 5, polyimide-based resin 16 is formed to the level of sidewall 5 at one time. After that, the top of the part other than sidewall 5 and the top of groove 25 are masked, exposed, and developed, which enables forming sidewall 5 having groove 25 by a one-time photolithography process.

Figure 5D:
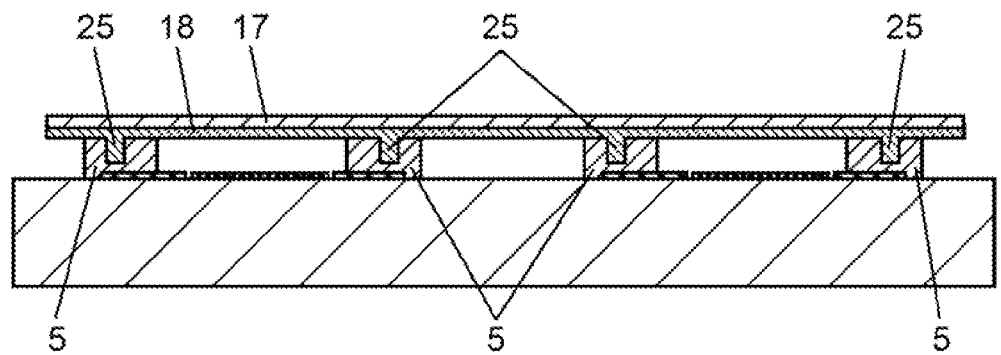
FIG. 5D is an explanatory diagram of the process.

Further, as shown in FIG. 5D, metal foil 17 becoming lid 7 is bonded onto the top surface of sidewall 5 through adhesive 18. This bonding pressure causes groove 25 to be filled with the adhesive of adhesive layer 6. That is, the protrusion amount of the adhesive is reduced by providing groove 25 in the top surface of sidewall 5. Owing to this groove 25, lid 7 can be bonded onto sidewall 5 with a sufficient pressure, which increases the close-contact strength between sidewall 5 and lid 7.

Next, metal foil 17 is etched into a given pattern shape by photolithography using a resist (not shown) from the top of metal foil 17. After that, the resist is removed to obtain the state of FIG. 5E. In this state, metal foil 17 shown in FIG. 5D is divided into lid 7 and adhesive-removed metal foil 22. Here, lid 7 is made removed from the entire top surface of sidewall 5. Consequently, lid 7 is formed inside the outer edge of the top surface of sidewall 5 viewed from above. This is because, when sidewall base layer 20 is provided on the outer side surface of sidewall 5 as well, if lid 7 protrudes outside the top surface of sidewall 5 viewed from above, base layer 19 undesirably becomes resistant to adhering to the outer side surface of sidewall 5 when sputter-forming base layer 19 thereafter. Meanwhile, the end of adhesive-removed metal foil 22 is desirably positioned inside the outer edge of the top surface of sidewall 5 viewed from above. This is because, if the end of foil 22 is positioned outside the outer edge of the top surface of sidewall 5 viewed from above, it is highly possible for adhesive layer 6 to protrude outside the top surface of sidewall 5 in the subsequent step of removing adhesive 18. Consequently, as a result that the end of foil 22 is positioned inside the outer edge of the top surface of sidewall 5, the end of adhesive layer 6 is formed equal to the outer edge of the top surface of sidewall 5 (i.e. the end of adhesive layer 6 runs along the outer edge of the top surface of the sidewall); or the end of adhesive layer 6 is formed inside the outer edge of the top surface sidewall 5, viewed from above acoustic wave element 1. When electrode base layer 9 is provided on the top surface of internal electrode 4, or when sidewall base layer 20 is provided on the outer side surface of sidewall 5 as well, the above condition prevents, base layer 19 from becoming resistant to adhering onto the outer side surface of sidewall 5 when sputter-forming base layer 19 after then.

Here, the adhesive area between sidewall 5 and lid 7 is larger than that between sidewall 5 and adhesive-removed metal foil 22.

Figure 5E:
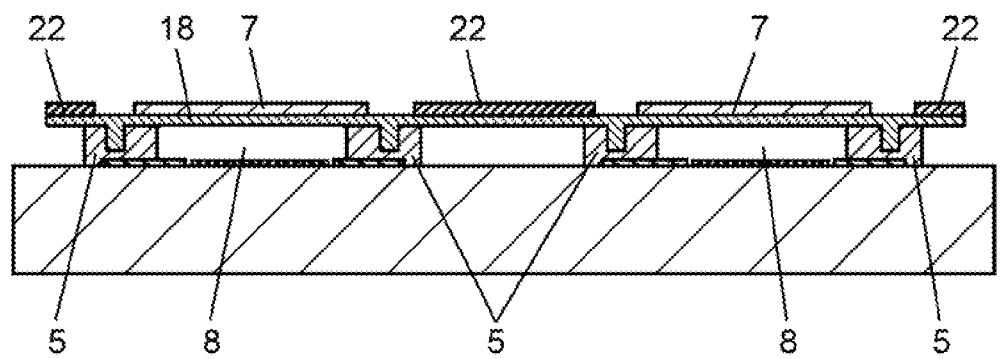
FIG. 5E is an explanatory diagram of the process.
Figure 5F:
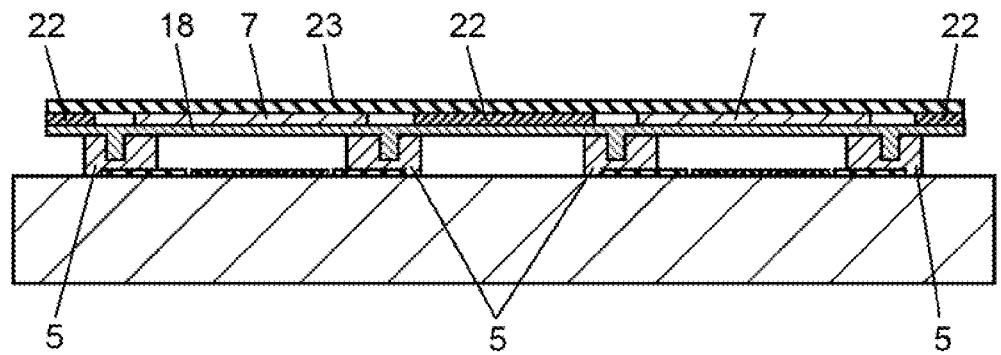
FIG. 5F is an explanatory diagram of the process.
Figure 5G:
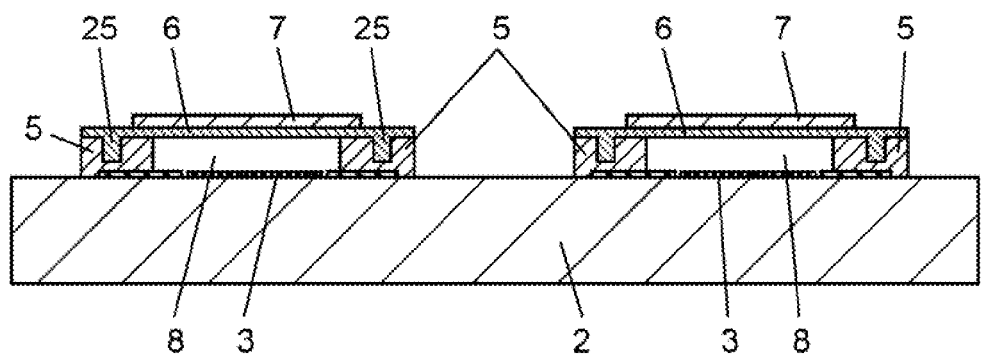
FIG. 5G is an explanatory diagram of the process.

Then, as shown in FIG. 5F, sticky tape 23 is applied onto the entire top surfaces of lid 7 and adhesive-removed metal foil 22. After that, tape 23 is removed from lid 7 and other parts to obtain the state of FIG. 5G. At this moment, the adhesive strength between sidewall 5 and lid 7 through adhesive 18 is stronger than that between tape 23 and lid 7, and thus lid 7 remains on sidewall 5 as is. Meanwhile, the adhesive strength between tape 23 and adhesive-removed metal foil 22 is stronger than that between sidewall 5 and foil 22 through adhesive 18, and thus foil 22 is removed together with tape 23 when removed from lid 7 and other parts. Herewith, as shown in FIG. 5G, lid 7 and adhesive layer 6 cover space 8 above IDT electrode 3, and adhesive layer 6 is formed so as to protrude outside the outer edge of lid 7. FIG. 5G shows a state in which adhesive layer 6 is formed on the roughly entire top surface of sidewall 5 as an example.

Possible ways of obtaining the state of FIG. 5G from that of FIG. 5E include the following. That is, as shown in FIG. 5F, metal plating is provided at the nearly central part on adhesive-removed metal foil 22, and then the plating is pressed downward from above to cut off unnecessary adhesive 18 between foil 22 and sidewall 5. Herewith, as shown in FIG. 5G, adhesive layer 6 is formed so as to protrude outside the outer edge of lid 7.

Figure 5H:
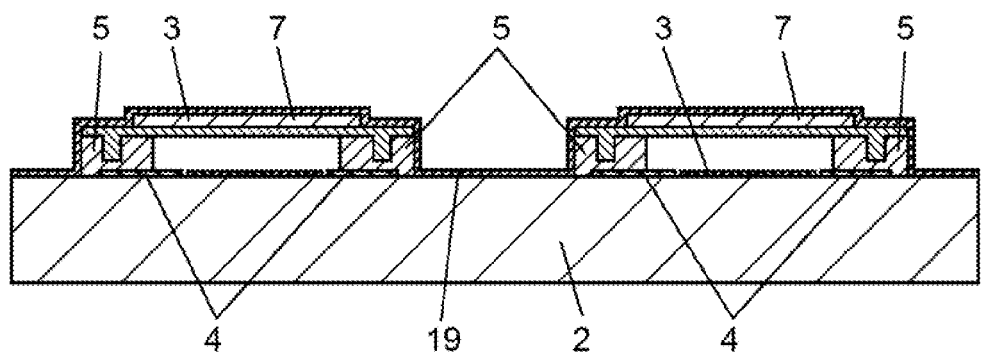
FIG. 5H is an explanatory diagram of the process.
Figure 5I:
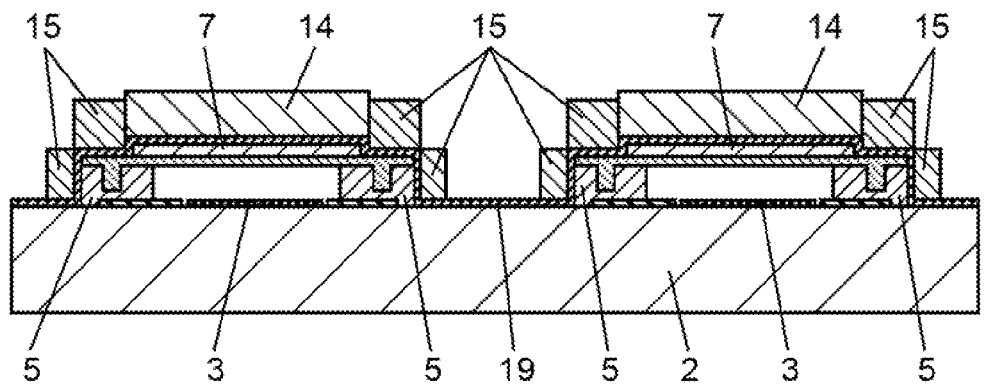
FIG. 5I is an explanatory diagram of the process.

Next, as shown in FIG. 5H, base layer 19 is formed on the entire main surface of piezoelectric substrate 2 by sputtering. Out of this base layer 19, the part formed on the top surface of lid 7 becomes lid base layer 13. When plated metal is formed also on the outer side surface of sidewall 5, the part formed on the outer side surface of sidewall 5 becomes sidewall base layer 20.

Figure 5J:
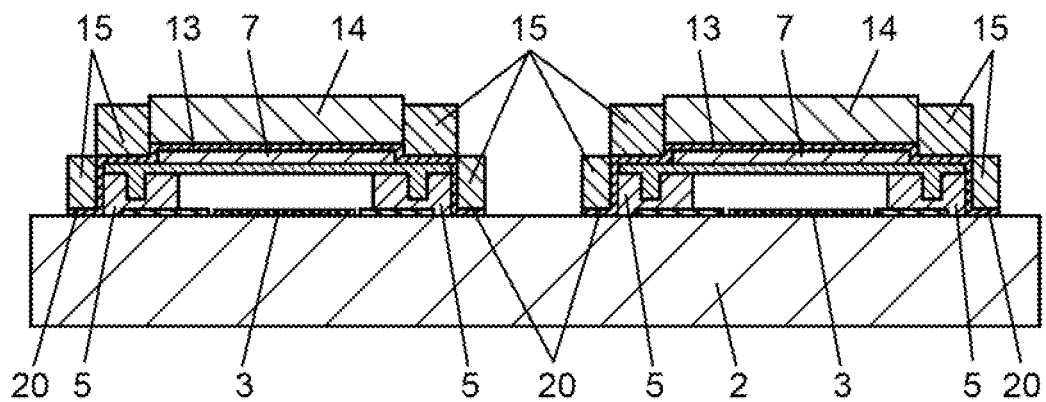
FIG. 5J is an explanatory diagram of the process.

Then, a resist is formed by a photolithography technique leaving a part where the resist (not shown) is grown by electrolytic plating. Concretely, the resist is formed while the top of base layer 19 becoming sidewall base layer 20 and the top of base layer 19 becoming lid base layer 13 are exposed, so as to cover the other part. Then, the first electrolytic plating is applied to form sidewall reinforcing layer 15 on sidewall base layer 20. Simultaneously, lid reinforcing layer 14 is formed on lid base layer 13 as well. In this manner, the state shown in FIG. 5J is obtained. In this way, as a result that lid reinforcing layer 14 and sidewall reinforcing layer 15 are formed, lid 7 and sidewall 5 can be reinforced. Further, sidewall reinforcing layer 15 is formed simultaneously with lid reinforcing layer 14, which enables forming layer 15 efficiently.

Further, a resist is formed on the entire main surface of piezoelectric substrate 2 except for a space where a connection electrode (not shown) is formed. Here, a resist is formed on the top surfaces of lid reinforcing layer 14 and sidewall reinforcing layer 15 as well. After that, as a result that the second electrolytic plating is applied, the resist where the connection electrode is formed is deposited to a higher level, and the resist is removed.

The following process may be used. That is, a resist is removed between at least one of the connection electrodes (not shown) and lid reinforcing layer 14 or sidewall reinforcing layer 15, and the connection electrode is connected to layer 14 or layer 15 in the first electrolytic plating process. This process prevents an electrically floating state of lid 7 and layer 14 or layer 15 to stabilize the electric potential. Specifically, by connecting lid 7 and layer 14 or layer 15 to a connection electrode becoming a ground terminal, lid 7 and layer 14 or layer 15 can be the ground potential. Herewith, lid 7 and layer 14 or layer 15 function as a shielding layer for protecting IDT electrode 3 from noise.

Further, as shown in FIG. 5J, sidewall base layers 20 are made electrically isolated from each other. Base layer 19 is removed by etching. Here, when lid reinforcing layer 14 or sidewall reinforcing layer 15 is intentionally connected to the connection electrode by plating, base layer 19 between layer 14 or layer 15 and the connection electrode (not shown) is not removed.

Figure 5K:
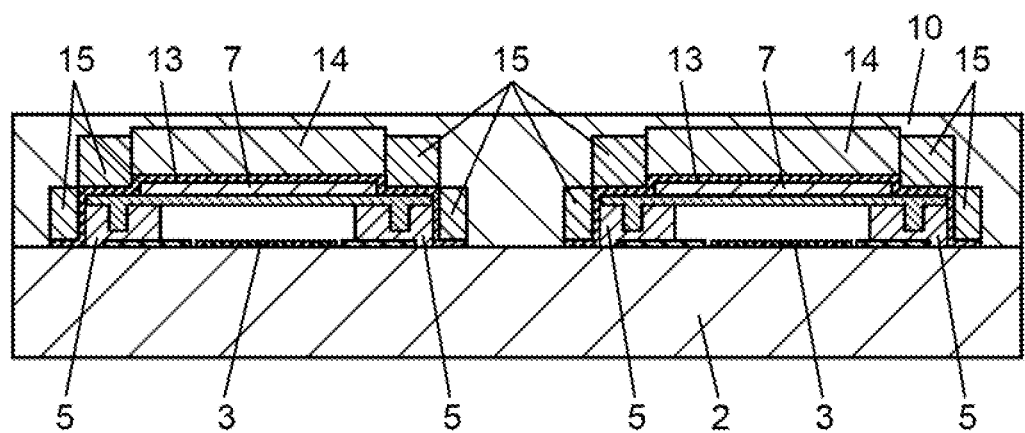
FIG. 5K is an explanatory diagram of the process.

Furthermore, as shown in FIG. 5K, insulating body 10 is formed covering the other main surface of piezoelectric substrate 2 and the structures on the main surface while the top surface of the connection electrode (not shown) is exposed. Insulating body 10 is formed by printing. To form insulating body 10 at a level completely the same as the connection electrode, the following process can be used as well. That is, insulating body 10 is once formed higher than the top surface of the connection electrode, and then body 10 is mechanically shaved. In this case, after body 10 is formed so as to cover all the structures on the main surface including the main surface of piezoelectric substrate and the connection electrode (not shown), body 10 may be mechanically shaved. Here, it is difficult to equalize the level of body 10 to that of the connection electrode without shaving the connection electrode at all when mechanically shaving body 10, resulting in the connection electrode partially shaved. When a connection electrode is formed by an electrolytic plating process, the electrode is desirably formed higher than is eventually needed allowing for the amount of shaving of the connection electrode. Shaving body 10 and the connection electrode in this way equalizes the levels of the top surfaces and increases the flatness as well, which provides a preferable structure in a mounting process.

Here, a resist (not shown) formed on lid reinforcing layer 14 and sidewall reinforcing layer 15 after the first electrolytic plating process may also serve as insulating body 10.

Finally, an external electrode (not shown) to be electrically connected to the top surface of the connection electrode (not shown) is formed. Then, piezoelectric substrate 2 and insulating body 10 are simultaneously cut off by dicing to produce fragmented acoustic wave elements 1 from the aggregate substrate.

Next, a description is made of a pattern layout of internal electrode 4 and sidewall 5 for acoustic wave element 1 of the first embodiment applied to an acoustic wave filter with reference to the related drawings.

Figure 6:
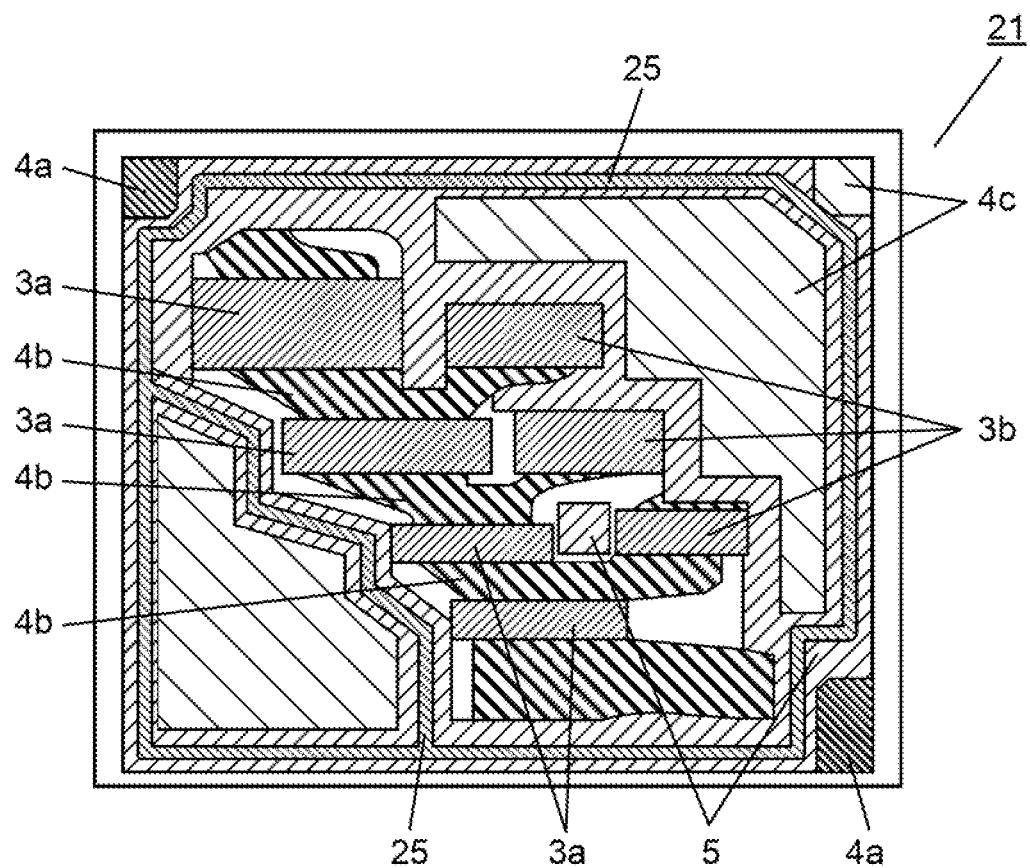
FIG. 6 is a schematic diagram of the top surface of an acoustic wave filter including an acoustic wave element according to the embodiment of the present invention with its insulating body and other components omitted.
Figure 7:
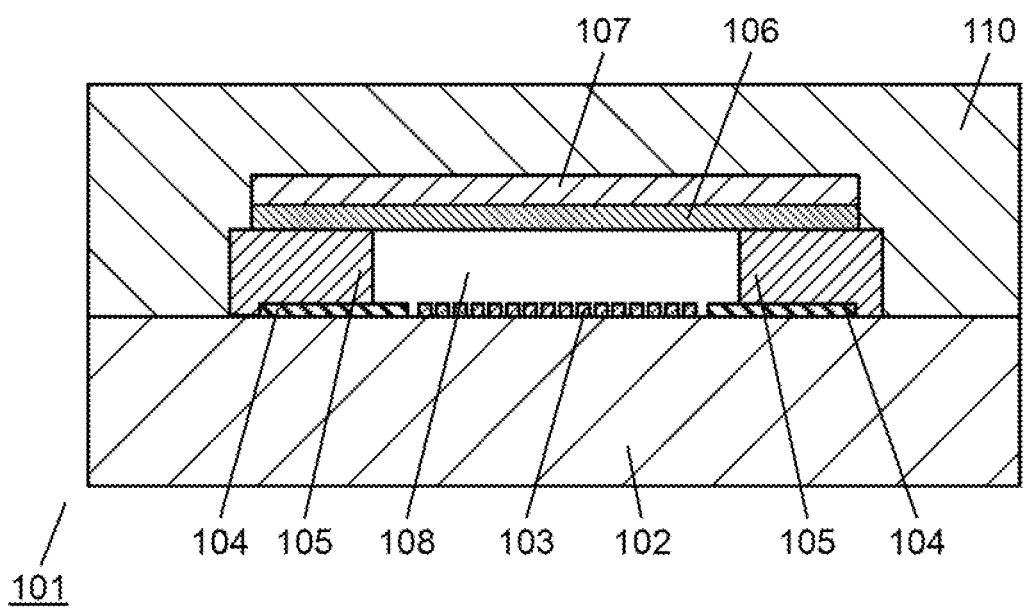
FIG. 7 is a schematic sectional view of a conventional acoustic wave element.

FIG. 6 is a schematic diagram of the top surface of acoustic wave filter 21 according to the first embodiment, showing a pattern layout of internal electrode 4 and sidewall 5. In FIG. 6, some part of internal electrode 4 is hidden by sidewall 5 and is not shown. Further, in FIG. 6, lid 7, lid reinforcing layer 14, insulating body 10, connection electrode 12, and other components are omitted to clarify the layout of internal electrode 4 and sidewall 5.

Acoustic wave filter 21 with acoustic wave element 1 of the first embodiment applied thereto includes two padding internal electrodes 4a, plural series IDT electrodes 3a, grounding internal electrode 4c, and parallel IDT electrode 3b. Two padding internal electrodes 4a are connected to an I/O terminal (not shown) on the front surface of piezoelectric substrate 2. Series IDT electrodes 3a are series-connected between two padding internal electrodes 4a through wiring internal electrode 4b. Grounding internal electrode 4c is connected to the ground terminal (not shown). Parallel IDT electrode 3b is connected between grounding internal electrode 4c and wiring pad electrode 4b.

FIG. 6 shows a layout of groove 25 in the top surface of sidewall 5. Groove 25 provided in the top surface of sidewall 5 reduces the protrusion amount of an adhesive. This enables lid 7 to be bonded onto sidewall 5 with a sufficient pressure, which increases the close-contact strength between sidewall 5 and lid 7. Further, groove 25 exhibits an anchor effect, which also increases the close-contact strength between sidewall 5 and lid 7. These conditions increase the reliability and yield of acoustic wave elements 1.

Acoustic wave element 1 of the first embodiment may be applied to another filter (not shown) such as a DMS filter as well as to a ladder-type filter. Further, element 1 may be applied to an electronic device including the filter, a semiconductor integrated circuit element (not shown) connected to the filter, and a reproducing device connected to the semiconductor integrated circuit element (not shown). This increases the communication quality of the filter and the electronic device.

An acoustic wave element of the present invention has an advantage of increased reliability, which is applicable to an electronic device such as a mobile communication device.

What is claimed is:

1. An acoustic wave element comprising:
   a piezoelectric substrate;
   an IDT (InterDigital Transducer) electrode placed on the piezoelectric substrate;
   a sidewall placed above the piezoelectric substrate and around the IDT electrode;
   a lid placed above the sidewall for covering a space above the IDT electrode; and
   an adhesive layer containing an adhesive placed between the lid and the sidewall,
   wherein a groove is formed in a top surface of the sidewall, and a portion of the adhesive is disposed in the groove.

2. The acoustic wave element of claim 1, wherein the groove is formed so as not to penetrate through the sidewall.

3. The acoustic wave element of claim 1, wherein the groove is formed so as to penetrate through the sidewall.

4. The acoustic wave element of claim 1, wherein a base area of the groove is larger than a top opening area of the groove formed in the top surface of the sidewall.

5. The acoustic wave element of claim 1 further comprising an insulating body for protecting the IDT electrode, wherein the adhesive layer is made of material of which adhesive strength per unit area to the insulating body is stronger than that to the sidewall.

6. An electronic device comprising:
   the acoustic wave element of claim 1;
   a semiconductor integrated circuit element connected to the acoustic wave element; and
   a reproducing device connected to the semiconductor integrated circuit element.

7. The acoustic wave element of claim 1, wherein an area size of an opening of said groove in the top surface of said sidewall is larger than an area size of a remainder of the top surface of said sidewall.

8. The acoustic wave element of claim 1, wherein an area size of an opening of said groove in the top surface of said sidewall is smaller than an area size of a remainder of the top surface of said sidewall.

9. The acoustic wave element of claim 1, wherein, when viewed in a vertical cross section, said groove is bordered by parts of said sidewall on both lateral sides of said groove.

10. The acoustic wave element of claim 1, wherein the groove penetrates through the sidewall from the top surface of the sidewall through a bottom surface of the sidewall.

11. The acoustic wave element of claim 1, wherein, in plan view, said sidewall is elongated, and said groove extends along a longitudinal direction of said sidewall.

12. An acoustic wave element comprising:
   a piezoelectric substrate;
   an IDT (InterDigital Transducer) electrode placed on the piezoelectric substrate;
   a sidewall placed above the piezoelectric substrate and around the IDT electrode;
   a lid placed above the sidewall for covering a space above the IDT electrode and provided inside an outer edge of the top surface of the sidewall; and
   an adhesive layer containing an adhesive placed between the lid and the sidewall,
   wherein the adhesive layer is formed so as to protrude outside an outer edge of the lid.

13. The acoustic wave element of claim 12, wherein the adhesive layer is formed inside the outer edge of the top surface of the sidewall.

14. The acoustic wave element of claim 12, wherein an end of the adhesive layer is formed so as to run along the outer edge of the top surface of the sidewall.

15. An electronic device comprising:
   the acoustic wave element of claim 12;
   a semiconductor integrated circuit element connected to the acoustic wave element; and
   a reproducing device connected to the semiconductor integrated circuit element.

* * * * *